United States Patent [15] 3,663,869
Strull [45] May 16, 1972

[54] BIPOLAR-UNIPOLAR TRANSISTOR STRUCTURE

[72] Inventor: Gene Strull, Baltimore, Md.
[73] Assignee: Westinghouse Electric Corporation, Pittsburgh, Pa.

[22] Filed: Jan. 26, 1971
[21] Appl. No.: 109,845

[52] U.S. Cl. ....................317/235, 317/234
[51] Int. Cl. ....................H01l 15/00
[58] Field of Search ....................317/234 S, 235 N

[56] References Cited

UNITED STATES PATENTS

| | | | |
|---|---|---|---|
| 2,976,426 | 3/1961 | Rappaport | 317/235 N |
| 2,980,831 | 4/1961 | Lehovec et al. | 317/235 |
| 3,096,442 | 7/1963 | Stewart | 317/235 N |
| 3,366,793 | 1/1968 | Svedberg | 317/235 N |
| 3,436,548 | 4/1969 | Biard et al. | 250/211 |

*Primary Examiner*—James D. Kallam
*Attorney*—F. H. Henson, E. P. Klipfel and D. Schron

[57] ABSTRACT

A unipolar-bipolar amplifying structure which combines the use of a photosensitive thin film unipolar transistor structure with a conventional single crystal bipolar structure whereby the bipolar transistor characteristics can be varied in response to changes in radiation incident on the unipolar thin film device.

6 Claims, 5 Drawing Figures

BIPOLAR-UNIPOLAR TRANSISTOR STRUCTURE

BACKGROUND OF THE INVENTION

As is known, the usual planar transistor is formed in a single crystal of semiconductive material having diffused areas forming adjacent regions of different conductivity types. A junction between two such regions, particularly an emitter-base junction, extends to the surface of the semiconductive wafer and is bounded at said surface by an edge of the junction, which usually extends around the perimeter of the emitter region. Such a transistor, called a bipolar transistor, is characterized by a low input impedance and is dependent upon the flow of minority carriers.

The field effect transistor differs distinctly from the conventional junction bipolar transistor since its operation depends upon the flow of majority carriers rather than minority carriers. Therefore, it falls in the class of unipolar transistors, or those in which only one type of carrier predominates. The field effect transistor, unlike a bipolar transistor, exhibits a high input impedance; and in this respect it resembles a vacuum tube. In the past, combinations of the unipolar and bipolar transistors have been provided as unipolar-bipolar amplifiers which combine high input impedance and high gain with regard to voltage, current and power.

SUMMARY OF THE INVENTION

In accordance with the present invention, a new and unique solid-state unipolar-bipolar amplifying structure is provided which combines the use of a photosensitive, preferably polycrystalline deposited, material with single crystal bipolar transistor structures whereby characteristics of the bipolar transistor can be varied by varying the radiation incident on the photosensitive unipolar structure. The structure of the invention includes the usual planar transistor configuration comprising a collector region of one conductivity type having diffused therein a base region of the other conductivity type. Diffused into the base region, centrally thereof, is an emitter region of the same conductivity type as the collector. With this arrangement, P-N junctions intersect the surface of the diffused single crystal wafer of semiconductive material between the base and emitter regions and between the base and collector regions. The usual electrodes are provided in contact with the collector, the emitter, and the base for connection to external electrical circuitry.

In one embodiment of the invention shown herein, above the surface of the semiconductive wafer between the emitter and base regions, and overlapping the emitter and base contacts, is a thin film of a semiconductive material such as cadmium sulfide or any other semiconductive material which will generate electron-hole pairs upon exposure to radiation. With this configuration, the emitter and base contacts of the bipolar transistor serve as the source and drain electrodes of the unipolar or field effect transistor. On the top surface of the thin film deposition is a conducting region which serves as the gate contact for the unipolar transistor. Depending upon the conductivity of the material chosen for the unipolar transistor and the desired application, an insulating material such as silicon monoxide may be deposited on the thin film of semiconductive material, followed by the placement of the thin film unipolar gate contact. This results in an essentially infinite direct current impedance through the device.

In other embodiments of the invention, a semiconductive material is deposited on the surface of a planar bipolar transistor between the base and collector regions, or between the emitter and collector regions. The material chosen for the unipolar transistor may be selected due to a particular spectral response characteristic. For example, if cadmium sulfide is utilized, response from the visible to the ultraviolet is obtained. Thus, the properties of the structure may be affected by radiation in the ultraviolet. This changes the properties of the unipolar transistor, the degree of change being dependent upon the electrical bias conditions which read out at a variety of levels as well as the gain obtained from the bipolar portion of the device.

The above and other objects and features of the invention will become apparent from the following detailed description taken in connection with the accompanying drawings which form a part of this specification, and in which.

Figure 2:
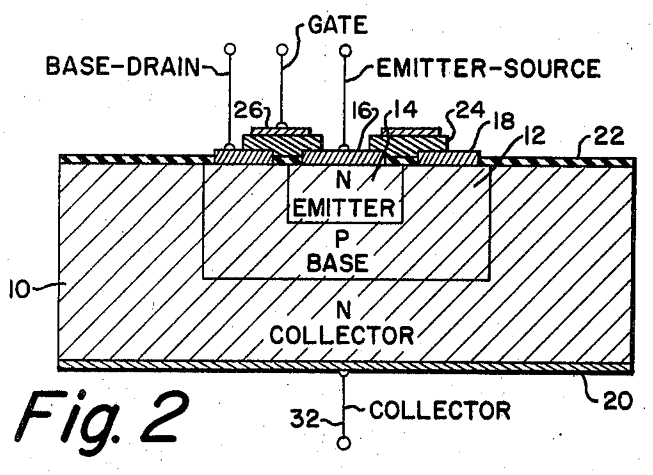
FIG. 2 is a cross-sectional view of the transistor shown in FIG. 1.
Figure 4:
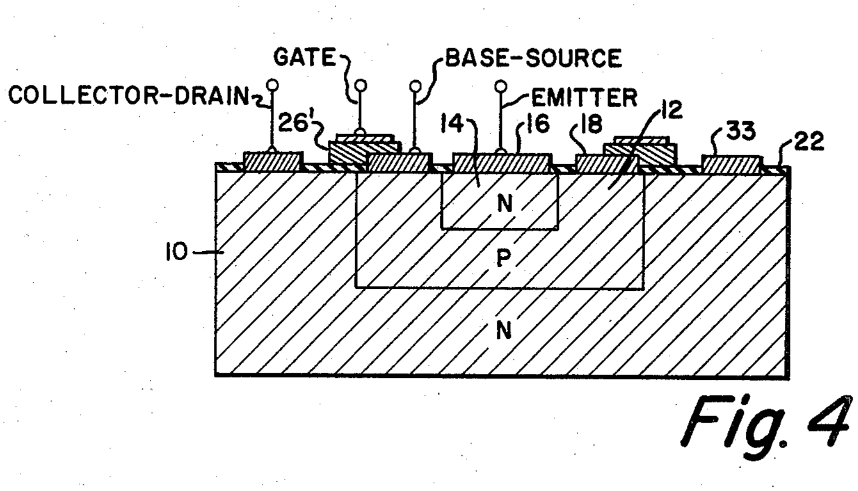
Figure 5:
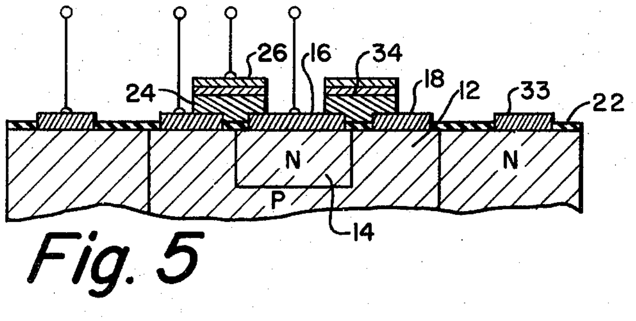

FIG. 4 is a cross-sectional view, similar to that of FIG. 2, of another embodiment of the invention wherein semiconductive material forming a unipolar transistor structure is deposited between the base and collector regions of the transistor; and FIG. 5 is a cross-sectional view of still another embodiment of the invention wherein the layer of semiconductive material between two regions of opposite conductivity type of a bipolar transistor are insulated from contacts by means of an oxide film.

Figure 1:
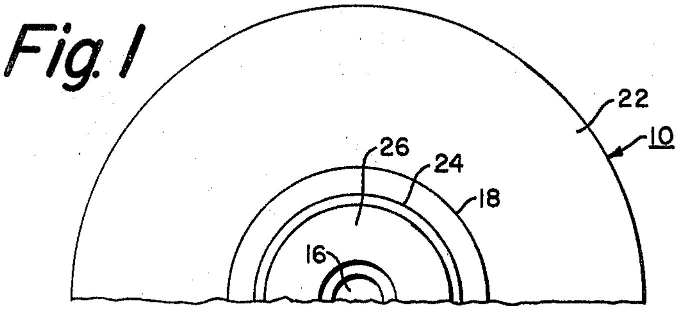
FIG. 1 is a top view of one embodiment of the invention wherein a thin layer of semiconductive material is deposited between the emitter and base regions of a bipolar transistor.

With reference now to the drawings, and particularly to FIG. 1, the transistor structure shown includes a wafer 10 of semiconductive material, such as silicon, having diffused therein a region of P-type conductivity 12. Diffused into the region of the P-type conductivity 12, in turn, is a region 14 of N-type conductivity. With this arrangement, the original wafer 10 comprises the collector of an N-P-N transistor; the region 12 comprises the base of the transistor; and the region 14 comprises the emitter.

Although the transistor configuration shown in FIG. 1 is circular, the structure may be rectangular or of any geometry. Deposited onto the N-type emitter is a metallic contact 16; while the P-type base is provided with a metalized contact 18. The contact for the collector is provided by means of a metalization 20 on the bottom of the wafer 10. The regions of the surface of the wafer 10 which are not engaged by the contacts 16 and 18 are covered with an oxide layer 22.

Deposited onto the contacts 16 and 18, so that it spans the P-N junction between the base 12 and emitter 14, is a layer 24 of semiconductive material having a contact 26 thereon. With this arrangement, the emitter 14 of the bipolar planar transistor forms the source of a field effect transistor; the base 12 forms the drain of the field effect transistor; and the layer 24 of semiconductive material forms the gate of a field effect transistor. More specifically, the structure just described forms an isolated gate field effect transistor. In this type of field effect transistor, a channel is formed between the base 12 and emitter 14 (also between the gate and source of the field effect transistor by an inversion beneath the surface of the planar transistor). That is, the channel is produced by an inversion of conductivity type resulting from the interaction of the silicon surface of the planar transistor, the silicon oxide layer 22 and the semiconductive layer 24. Furthermore, this inversion channel will vary the emitter-base characteristics of the planar transistor. When light or other radiant energy is incident upon the semiconductive material 26, electron-holes will be generated therein which will also vary the characteristics of the channel and, hence, the characteristics of both the field effect transistor and the planar transistor beneath it.

Figure 3:
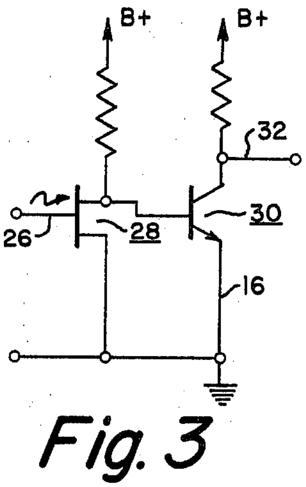
FIG. 3 is an equivalent circuit diagram for the transistor structure of FIGS. 1 and 2.

An equivalent circuit for the device is shown in FIG. 3. An input signal can be applied between the electrodes 16 and 26; and this input signal will see a very high impedance input. The drain electrode of the field effect transistor, identified by the reference numeral 28 in FIG. 3, is connected directly to the base of the planar transistor 30 by virtue of the fact that the two are formed by a common region 12. Output signals will then appear between the electrode 32 connected to the collector of the planar transistor 30 and the emitter-source electrode 16. Variation of the input signal applied between the gate and source electrodes of the field effect transistor will modulate the output from transistor 30. Similarly, variations in incident radiation on the semiconductive ring 24 will likewise cause variations in the output signal to produce modulation.

In FIG. 4, another embodiment of the invention is shown wherein elements corresponding to those of FIGS. 1 and 2 are identified by like reference numerals. In this case, however, a surrounding region 26' of semiconductive material spans the P-N junction between the collector 10 and base 12. A region of conductive material 33 makes contact to the collector 10. Other possible ramifications are to cause the region of semiconductive material to span the emitter and collector, or to span transistor regions of a multitransistor functional block or between any other regions of the block, such as between transistors and resistors. In all cases, the inversion effect described above will produce a channel between the regions to vary the transistor characteristics in response to light or an applied signal.

In FIG. 5, still another embodiment of the invention is shown wherein an oxide layer 34 is deposited between the region 24 of semiconductive material and the contact 26. This results in an essentially infinite direct current impedance through the device.

The material chosen for the region 24 of semiconductive material can be chosen for a particular spectral response characteristic. For example, if cadmium sulfide is utilized as the semiconductive material, it will be responsive to both visible and ultraviolet light. Thus, the properties of the structure may be affected by radiation in the ultraviolet. This changes the properties of the unipolar transistor; and the degree of change can be made dependent upon the electrical bias conditions with read out at a variety of levels as well as gain obtained from the bipolar portion of the device. Other materials which can be used, depending upon the spectral response desired, are the sulfides, selenides, tellurides and oxides of zinc and lead.

Although the invention has been shown in connection with certain specific embodiments, it will be readily apparent to those skilled in the art that various changes in form and arrangement of parts may be made to suit requirements without departing from the spirit and scope of the invention.

I claim as my invention:

1. A bipolar-unipolar transistor structure comprising a body of semiconductive material having a collector region of one conductivity type intersecting a surface of said wafer, a base region of the other conductivity type diffused into said collector region and intersecting said surface, an emitter region of the same conductivity type as said collector diffused into said base region and intersecting said surface such that the P-N junctions between said emitter and base regions and between said base and collector regions extend to said surface, electrical contacts engaged with said emitter, base and collector regions, an oxide layer covering said surface of the wafer not covered by said contacts, a layer of semiconductive material deposited on said oxide layer, said layer of semiconductive material spanning at least one of said P-N junctions and being formed from a material productive of electron-hole pairs upon exposure to radiation, and an electrode connected to said layer of semiconductive material, the electrodes connected to said layer of semiconductive material, said base region and said emitter region comprising the gate, drain and source electrodes of a unipolar transistor, the transistor formed in said wafer being responsive to incident radiation upon the layer of semiconductive material on said oxide layer.

2. The bipolar-unipolar transistor structure of claim 1 wherein said layer of semiconductive material spans the P-N junction between said emitter and base regions.

3. The bipolar-unipolar transistor structure of claim 1 wherein said layer of semiconductive material spans the P-N junction between said collector and base regions.

4. The bipolar-unipolar transistor structure of claim 1 including an oxide layer disposed between said layer of semiconductive material and a contact for said layer of semiconductive material.

5. The bipolar-unipolar transistor structure of claim 1 wherein said layer of semiconductive material is polycrystalline.

6. The bipolar-unipolar transistor structure of claim 1 wherein said layer of semiconductive material comprises cadmium sulfide.

* * * * *